United States Patent
Wang et al.

(10) Patent No.: US 8,507,991 B2
(45) Date of Patent: Aug. 13, 2013

(54) SEMICONDUCTOR DEVICE AND METHOD OF MANUFACTURING THE SAME

(75) Inventors: Wenwu Wang, Beijing (CN); Kai Han, Beijing (CN); Shijie Chen, Beijing (CN); Xiaolei Wang, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/517,893

(22) Filed: Jun. 14, 2012

(65) Prior Publication Data
US 2012/0261761 A1    Oct. 18, 2012

Related U.S. Application Data

(62) Division of application No. 13/063,564, filed as application No. PCT/CN2010/074371 on Jun. 24, 2010, now Pat. No. 8,222,099.

(30) Foreign Application Priority Data

Dec. 29, 2009    (CN) .......................... 2009 1 0244131

(51) Int. Cl.
 H01L 29/76    (2006.01)
 H01L 29/94    (2006.01)
 H01L 27/108   (2006.01)
 H01L 31/119   (2006.01)
 H01L 31/062   (2012.01)

(52) U.S. Cl.
 USPC ........... 257/368; 257/295; 257/310; 257/153; 257/412

(58) Field of Classification Search
 USPC ................ 257/368, 151, 153, 249, 314, 295, 257/310, 412, 331, 366, 387
 See application file for complete search history.

(56) References Cited

U.S. PATENT DOCUMENTS

2010/0320542 A1* 12/2010 Kawahara et al. ............ 257/369
2012/0025327 A1*  2/2012 Ji et al. ........................ 257/411

* cited by examiner

Primary Examiner — Chuong A. Luu
(74) Attorney, Agent, or Firm — Troutman Sanders LLP

(57) ABSTRACT

A semiconductor device is provided. A multi-component high-k interface layer containing elements of the substrate is formed from an ultra-thin high-k dielectric material in a single-layer structure of atoms by rapid annealing in the manufacturing of a CMOS transistor by the replacement gate process, and a high-k gate dielectric layer with a higher dielectric constant and a metal gate layer are formed thereon. The EOT of the device is effectively decreased, and the diffusion of atoms in the high-k gate dielectric layer from an upper level thereof is effectively prevented by the optimized high-k interface layer at high-temperature treatment.

6 Claims, 8 Drawing Sheets

US 8,507,991 B2

SEMICONDUCTOR DEVICE AND METHOD OF MANUFACTURING THE SAME

BENEFIT CLAIMS

This application is a divisional of U.S. patent application Ser. No. 13/063,564, filed Mar. 11, 2011 now U.S. Patent No. 8,222,099, which is a US National Stage of International Application No. PCT/CN2010/074371, filed Jun. 24, 2010, which claims the benefit of CN 200910244131.3, filed Dec. 29, 2009.

FIELD OF THE INVENTION

The present invention relates to a semiconductor device and a method of manufacturing the same, and more specifically, to a high-k gate dielectric/metal gate device with optimized interface based on a replacement gate process, and a method of manufacturing the same.

BACKGROUND OF THE INVENTION

With the development of the semiconductor industry, integrated circuits with higher performance and more powerful functions require greater element density. Thus, the sizes of the components need to be scaled further. The utilization of the core technology for 22 nanometers and beyond technology of integrated circuits has been the inevitable trend for the development of integrated circuits, which are also the projects for major international semiconductor companies and institutions to compete to develop. Study on CMOS device gate engineering with "high-k/metal gate" as the core technology is the most representative in 32/22 nanometer technology, and relevant studies on materials, processes and structures are conducted extensively. At present, the study on high-k gate dielectric/metal gate technology may comprise the gate-first process and the replacement gate process. In the gate-first process, the gate is formed before formation of the source and drain regions, while in the replacement gate process, of the gate is formed after formation of the source and drain regions. And in the replacement gate process, it is not necessary for the gate to be under high temperature for annealing.

For a MOS device with a high-k/metal gate structure, the quality of a high-k gate dielectric film and the interface property associated therewith directly affect the electrical properties of the device, especially the equivalent oxide thickness (EOT) and channel carrier mobility of the device. At present, in order to decrease EOT, the dielectric constant of the high-k gate dielectric material may be enhanced and the interface layer with low dielectric constant between the high-k gate dielectric and the semiconductor substrate may be thinned by optimization of the materials for the gate dlelectric. With the continuous thinning of the interface layer, some atoms in the high-k gate dielectric material may be diffused into the channel region of the semiconductor substrate through the ultra-thin interface layer in high-temperature thermal treatment, which may disadvantageously degrade the carrier mobility of the channel region.

Therefore, in order to make compromise between the decrease of EOT and the degradation of carrier mobility of CMOSFET devices, there is a need for a new semiconductor device and a method of manufacturing the same.

SUMMARY OF THE INVENTION

In view of the above-mentioned problems, the present invention proposes a method of manufacturing a semiconductor device. The method comprises: providing a semiconductor substrate having a first region and a second region, wherein the first region and the second region are isolated from each other by an isolation region; forming a dummy gate oxide layer, a dummy gate and a sidewall spacer thereof belonging to the first region and the second region on the semiconductor substrate, respectively; forming a source region and a drain region belonging to the first region and the second region on the semiconductor substrate, respectively; and forming an inner dielectric layer covering the source region and drain region of the first and second regions and the isolation region of the first and second regions; removing the dummy gates of the first and second regions to form a first opening and a second opening, and alternatively, the dummy gate oxide layers may be further removed; forming, in the first opening and the second opening, a first high-k interface layer belonging to the first region and a second high-k interface layer belonging to the second region, respectively, wherein the first and second high-k interface layers contain elements of the substrate; forming a first high-k gate dielectric layer on the first high-k interface layer, and forming a second high-k gate dielectric layer on the second high-k interface layer, wherein the dielectric constants of the first high-k gate dielectric layer and the second high-k gate dielectric layer are higher than those of the first and second high-k interface layers, respectively; forming a first metal gate layer on the first high-k gate dielectric layer, and forming a second gate layer on the second high-k gate dielectric layer; processing the device to form a first gate stack belonging to the first region and a second gate stack belonging to a second region, respectively. The first high-k interface layer and the second high-k interface layer are formed of elements selected from a group comprising: $HfO_2$, $ZrO_2$, $HfZrO_x$, $HfSiO_x$, $Al2O3$, $HfAlO_x$, $LaAlO_x$, $Gd_2O_3$, and oxide, silicate and nitride of other rare earth, etc. The first and second high-k interface layers have a thickness in a range from about 0.1 to 1 nm. The formation of the first and second high-k interface layers may follow the steps of: depositing one or more layers of high-k dielectric material in a single-layer structure of atoms in the first opening and the second opening, respectively; and performing annealing at high temperature to form the first and second high-k interface layers containing elements of the substrate on the substrate in the first and second openings. The formation of the first and second high-k interface layers may also follow the steps of: depositing one or more layers of high-k dielectric material in a single-layer structure of atoms in the first opening and second opening, respectively; performing annealing at high temperature; repeating these two steps.

The present invention further provides a device manufactured according to the above method. The device comprises: a semiconductor substrate having a first region and a second region, wherein the first region and the second region are isolated from each other by an isolation region; a first gate stack formed on the first region, and a second gate stack formed on the second region; and a source region and a drain region belonging to the first region and the second region, respectively; wherein the first gate stack comprises: a first high-k interface layer on the semiconductor substrate in the first region; a first high-k gate dielectric layer on the first high-k interface layer; and a first metal gate layer on the first high-k gate dielectric layer; the second gate stack comprises: a second high-k interface layer on the semiconductor substrate in the second region; a second high-k gate dielectric layer on the second high-k interface layer; and a second metal gate layer on the second high-k gate dielectric layer; and the material of the first and second high-k interface layers comprises elements of the material of the substrate, and dielectric constants of the first and second high-k gate dielectric layers are higher than those of the first and second high-k interface layers, respectively.

By forming a multi-component high-k interface layer containing elements of the substrate from an ultra-thin high-k dielectric material in a single-layer structure of atoms by rapid annealing, and forming a high-k gate dielectric layer with a higher dielectric constant thereon, the present invention may effectively reduce the EOT of the device, and prevent the diffusion of atoms in the high-k gate dielectric layer from an upper level thereof at high-temperature treatment by the optimized high-k interface layer. Thus, the present invention advantageously avoids growth of the interface layers and degradation of carrier mobility. Furthermore, the present invention may further alleviate the problem of high interface state and interface roughness caused by direct contact of the high-k gate dielectric layer with high dielectric constant and the substrate, and thus the overall performance of the device is effectively enhanced.

DETAILED DESCRIPTION OF THE PREFERRED EMBODIMENTS

The present invention generally relates to a semiconductor device and a method of manufacturing the same, and more particularly, to a high-k gate dielectric/metal gate device with optimized interface based on the replacement gate process, and a method of manufacturing the same. The following disclosure provides a plurality of different embodiments or examples to achieve different structures of the present invention. To simplify the disclosure of the present invention, description of the components and arrangements of specific examples is given below. Of course, they are only illustrative and not intended to limit the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

Figure 1:
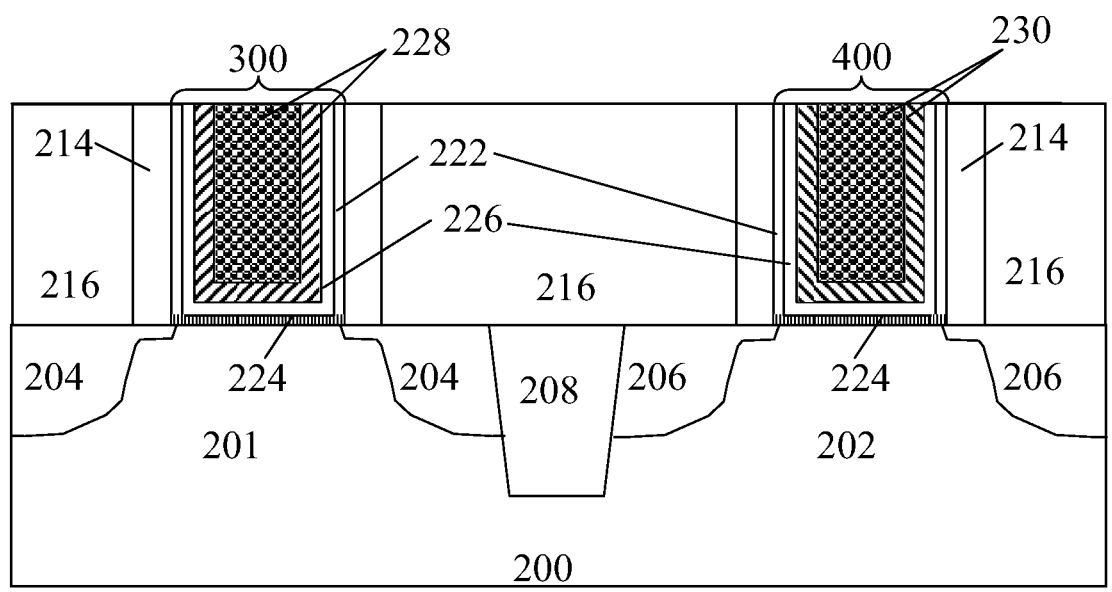
FIG. 1 is a structural diagram of a semiconductor device according to an embodiment of the present invention.

With reference to FIG. 1, FIG. 1 is a structural diagram of a semiconductor device according to an embodiment of the present invention. As shown in FIG. 1, the device comprises: a semiconductor substrate 200 having a first region 201 and a second region 202, wherein the first region 201 and the second region 202 are isolated from each other by an isolation region 208; a first gate stack 300 being on the first region 201 and a second gate stack 400 being on the second region 202, and a source region and a drain region belonging to the first region and second region, respectively; wherein the first gate stack 300 comprises: a first high-k interface layer 224 on the semiconductor substrate 200 in the first region 201; a first high-k gate dielectric layer 226 on the first high-k interface layer 224; a first metal gate layer 228 on the first high-k gate dielectric layer 226; and the second gate stack 400 comprises: a second high-k interface layer 224 on the semiconductor substrate 200 in the second region 202; a second high-k gate dielectric layer 226 on the second high-k interface layer 224; a second metal gate layer 230 on the second high-k gate dielectric layer 226; wherein the material of the first and second high-k interface layers 224 comprises elements of the materials for the substrate, and dielectric constants of the first and second high-k gate dielectric layers 226 are higher than that of the first and second high-k interface layers 224, respectively.

Optionally, it further comprises interface layers between the first and second high-k gate dielectric layers and the substrate.

The first and second high-k interface layers 224 may be formed of the same materials or of different materials, and the first metal gate layer 228 and the second metal gate layer 230 are a single-layered or multi-layered structure, which may be formed of the same material or of different materials.

Figure 2:
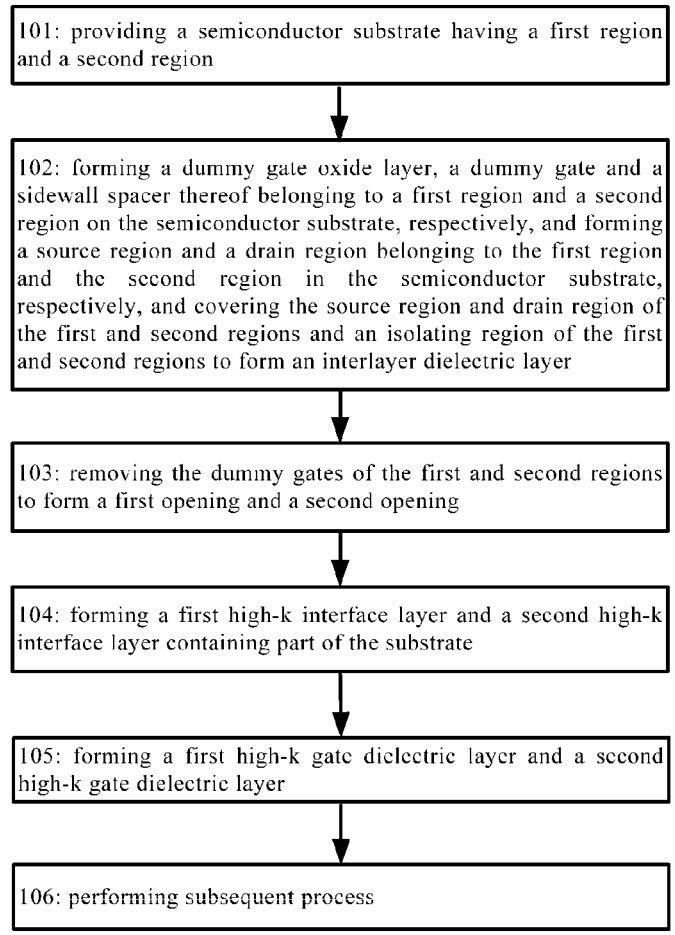
FIG. 2 is a flowchart illustrating a method of manufacturing a semiconductor device according to an embodiment of the present invention.

Hereinafter, manufacturing and implementation of the embodiment will be described in detail with reference to FIG. 2. FIG. 2 is a flowchart of a method of manufacturing a semiconductor device according to an embodiment of the present invention.

Figure 3:
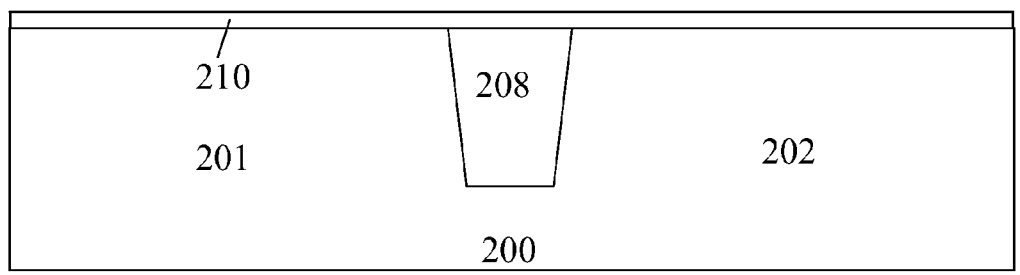
FIGS. 3-15 are diagrams illustrating the steps of manufacturing a semiconductor device according to an embodiment of the present invention.

In step 101, a semiconductor substrate 200 having a first region 201 and a second region 202 is provided, wherein the first region 201 and the second region 202 are isolated from each other by an isolation region 208, as shown in FIG. 3. In this embodiment, the substrate 200 may be a silicon substrate in a crystal structure (for example a wafer), and may further comprise other basic semiconductor or compound semiconductor, for example, Ge, GeSi, GaAs, InP, SiC, or diamond, etc. According to design specifications known in the prior art (for example, a p-type substrate or an n-type substrate), the substrate 200 may comprise various kinds of doping configurations. Further, the substrate 200 may alternatively comprise an epitaxial layer such that it may be manipulated under stress so as to enhance the performance, and may comprise a silicon-on-insulator (SOI) structure.

In step 102, with reference to FIGS. 3-7, dummy gate oxide layers 201, dummy gates 212 and sidewall spacers 214 belonging to the first region 201 and the second region 202 are formed on the semiconductor substrate 200, respectively; source regions 204 and drain regions 204 belonging to the first region 201 and the second region 202 are formed in the semiconductor substrate 200, respectively; and an inner layer dielectric 216 is formed to cover the source regions 204 and the drain regions 204 belonging to the first region 201 and the second region 202, and to cover the isolation regions 208 in the first region 201 and second region 202.

Figure 4:
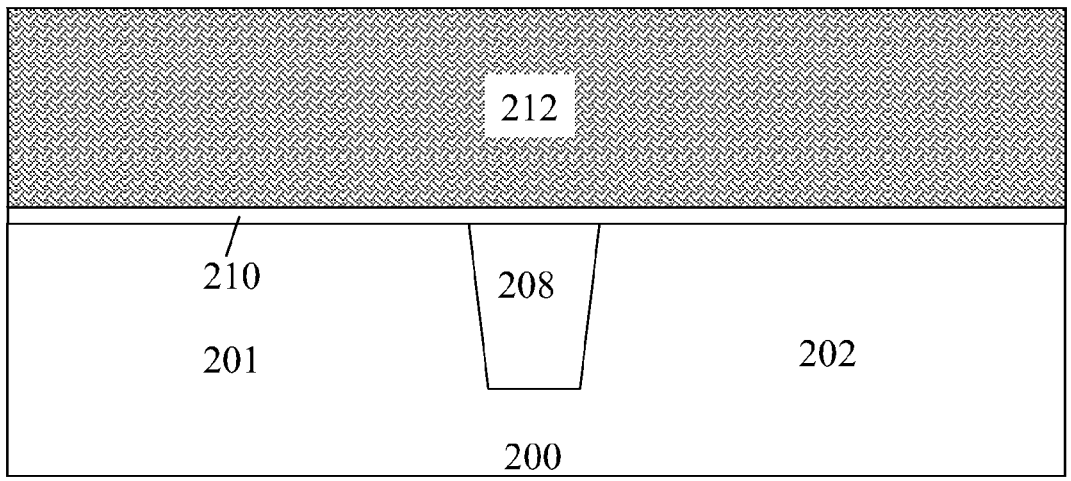
Figure 5:
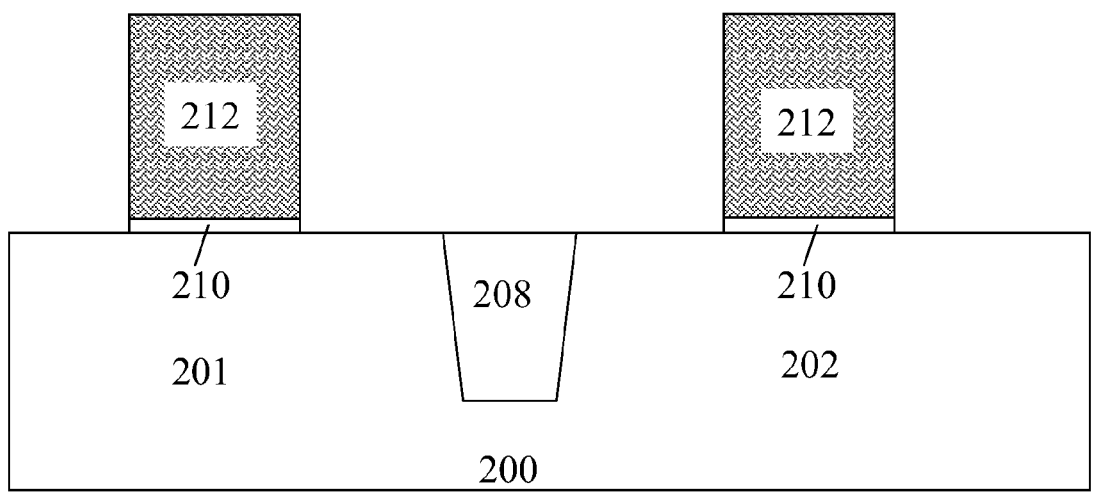

With reference to FIG. 3, a dummy gate oxide layer is deposited on the semiconductor substrate 200. The dummy gate oxide layer 210 may be a thermal oxide layer, comprising silicon oxide or silicon nitride, for example, silicon dioxide. A dummy gate layer 212 is deposited on the dummy gate oxide layer 210, as shown in FIG. 4. The dummy gate layer 212 may be amorphous silicon or polystalline silicon. In an embodiment, the dummy gate layer 212 comprises amorphous silicon. Then, dry or wet etching technology is used to form dummy gate oxide layers 210 and dummy gates 212 belonging to the first region 201 and the second region 202, respectively, as shown in FIG. 5.

Figure 6:
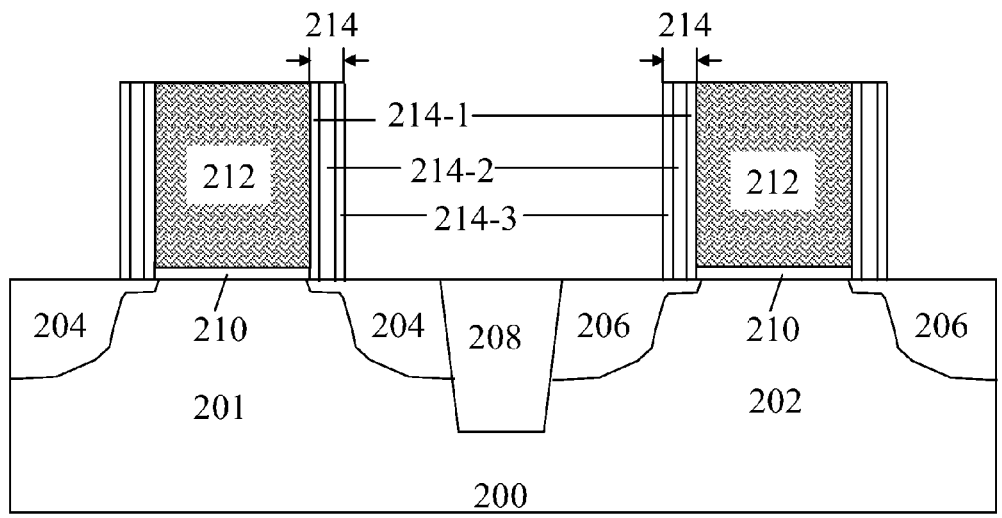

Sidewall spacers 214 are formed to cover the dummy gate oxide layer 210 and the dummy gate 212. The sidewall spacers 214 may be formed of silicon nitride, silicon oxide, silicon oxynitride, silicon carbide, fluoride dopant silicon glass, low-k dielectric materials, and any combination thereof, and/or other suitable materials. The sidewall spacers 214 may have a multi-layered structure. The sidewall spacers 214 may be formed by depositing a suitable dielectric material through Atomic Layer Deposition (ALD), Plasma-Enhanced Chemical Vapor Deposition (PECVD) or other methods. In an embodiment, the sidewall spacer 214 is a three-layered structure, formed by a first sidewall spacer layer 214-1 such as $Si_3N_4$, a second sidewall spacer layer 214-2 such as $SiO_2$, and a third sidewall spacer layer 214-3 such as $Si_3N_4$ in sequence by deposition and etching, as shown in FIG. 6. The above description is only exemplary, and the present invention is not limited thereto. In order to simplify the description, the three-layered sidewall spacer comprising the first sidewall spacer layer 214-1, the second sidewall spacer layer 214-2, and the third sidewall spacer layer 214-3 are all depicted as the sidewall spacer 214 hereinafter.

The source/drain regions 204 and 206 may be formed by implanting p-type or n-type dopants or impurities into the substrate 200 in the first region 201 and second region 202 based on a desired transistor structure, as shown in FIG. 6. The source/drain regions 204 and 206 may be formed by lithography, ion implantation, diffusion and/or other suitable processes.

Figure 7:
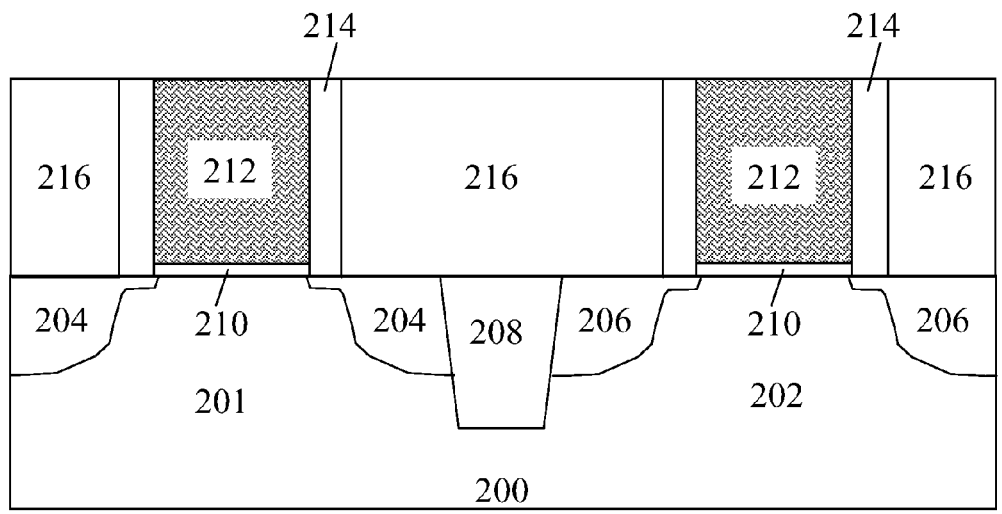

With reference to FIG. 7, an inner layer dielectric (ILD) 216 is deposited on the portions of the substrate 200 except the sidewall spacers 214 and the dummy gates 212 of the first and second regions 201, 202. The inner layer dielectric (ILD) 216 may be, but not limited to, for example, undoped silicon dioxide ($SiO_2$), doped silicon oxide (for example, borosilicate glass, borophosphosilicate glass, etc) and silicon nitride ($Si_3N_4$). The inner layer dielectric 216 may be formed by, for example, Chemical Vapor Deposition (CVD), Physical Vapor Deposition (PVD), and Atom Layer Deposition (ALD), and/or other suitable processes.

Figure 8:
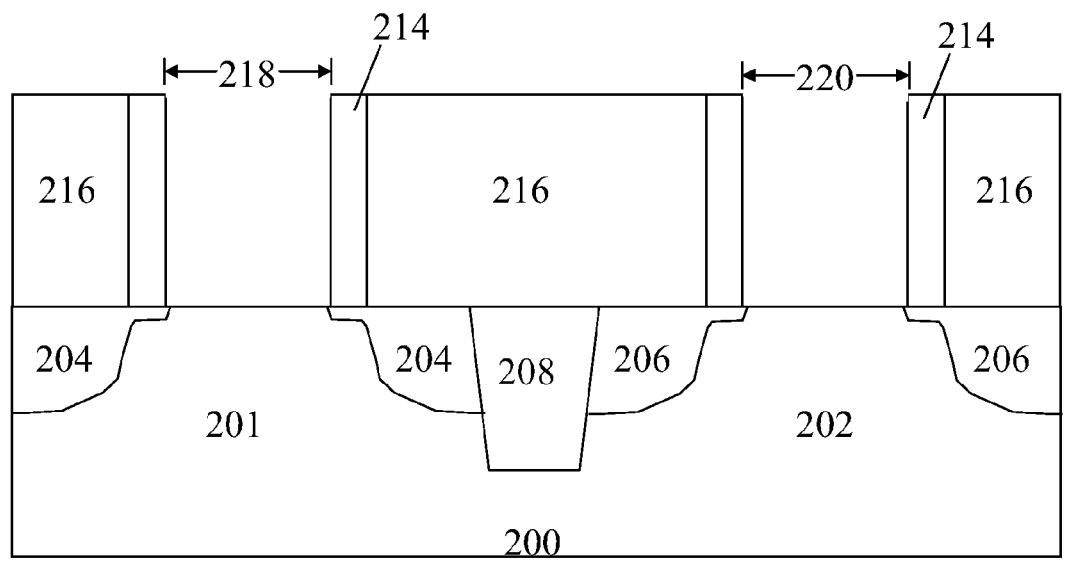

In step 103, with reference to FIG. 8, the dummy gates 212 are removed to form a first opening 218 and a second opening 220, respectively. In this embodiment, thereafter, the dummy gate oxide layer 210 may be removed to expose the substrate in order to form the first opening 218 and the second opening 220. In another embodiment, the dummy gate oxide layer 210 may be taken as the interface layer for subsequent steps. The dummy oxide layer 210 and the dummy gate 212 may be removed by wet etching or dry etching. In an embodiment, the wet etching process may utilize tetramethylammonium hydroxide (TMAH), KOH, or other suitable etching solution.

Figure 9:
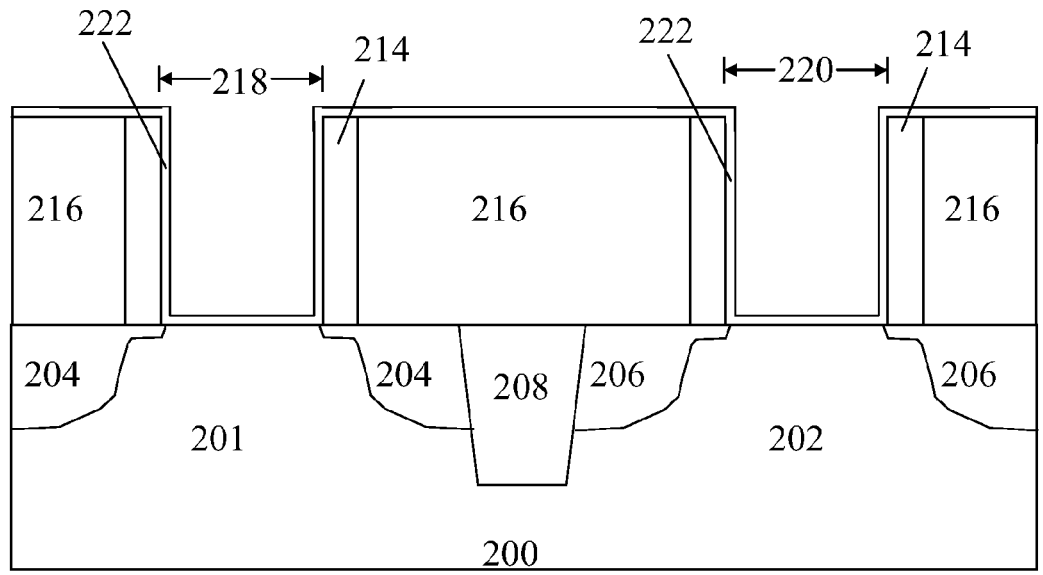
Figure 10:
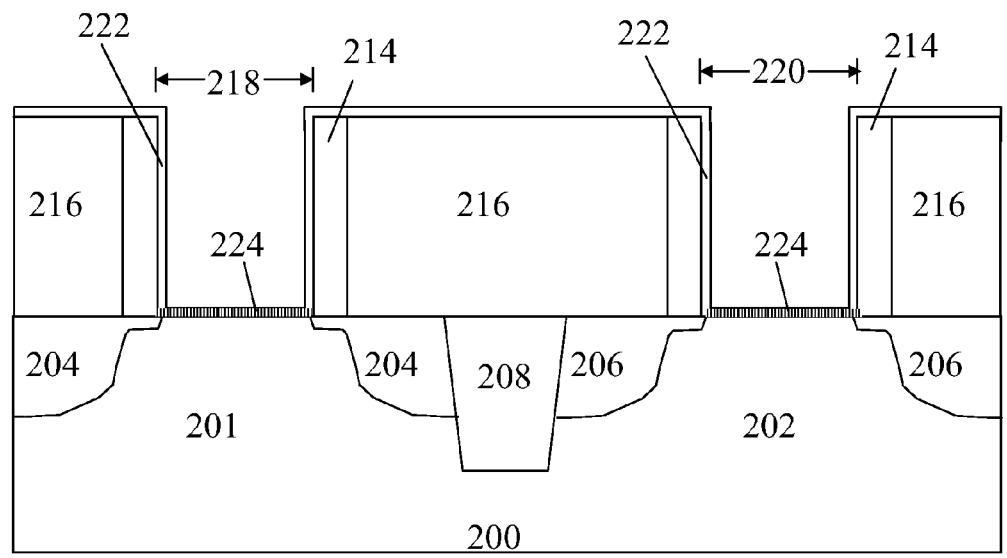

The flow then goes to 104, a first and a second high-k interface layers 224 are formed in the first opening 218 and the second opening 220, respectively, wherein the first high-k interface layer 224 belongs to the first region 201 and the second high-k interface layer 224 belongs to the second region 202, and wherein the first high-k interface layer 224 and the second high-k interface layer 224 contain elements of the substrate. The first and second high-k interface layers 224 containing elements of the substrate may be formed by depositing a high-k dielectric material in a single-layer structure of atoms on the semiconductor substrate 200, for example, the silicon substrate, as shown in FIG. 9, and then performing annealing at high temperature. The high-k dielectric material 222 in a single-layer structure of atoms may be $HfO_2$ or $HfZrO_X$, wherein X is binary or ternary. After annealing in oxygen environment, the high-k dielectric material on the substrate is converted into a multi-component material containing elements of the substrate, for example, $HfSiO_X$ or $HfZrSiO_X$, wherein X is ternary or quaternary, i.e., forming the first and second high-k interface layers 224, as shown in FIG. 10. The high-k dielectric material may also include $HfO_2$, $ZrO_2$, $HfZrO_X$, $HfSiO_X$, $Al_2O_3$, $HfAlO_X$, $LaAlO_X$, $Gd_2O_3$, and oxide, silicate, and nitride of other rare earth, etc, or any combination thereof The first and second high-k interface layers 224 have a thickness in the range of about 0.1-1 nm. The high-k dielectric material 222 in a single-layer structure of atoms may be deposited by sputtering, PLD, MOCVD, ALD, PEALD, or other suitable methods.

The formation of the first and second high-k gate dielectric layers may be implemented by one method comprising: depositing one or more layers of high-k dielectric material 222 in a single-layer structure of atoms in the first opening 218 and second opening 220; then performing annealing at high temperature to form the first and second high-k gate dielectric layers 224 containing elements of the substrate on the substrate in the first opening 218 and the second opening 220. The one or more layers of high-k dielectric material 222 in a single-layer structure of atoms have a thickness in the range of about 0.1-1 nm, the temperature of the high-temperature annealing is in the range from about 500° C. to 950° C., the time for the high-temperature annealing is in the range from about 1 second to 30 seconds, and the protective gas for the high-temperature annealing is $N_2$, $NH_3$, or $O_2$.

The formation of the first and second high-k gate dielectric layers may be implemented by another method comprising: a) depositing one or more layers of high-k dielectric material 222 in a single-layer structure of atoms in the first opening 218 and the second opening 220; b) performing annealing at high temperature; c) repeating steps a) and b), and forming the first and second high-k gate dielectric layers 224 containing elements of the substrate on the substrate in the first 218 and second opening 220 after multiple times of depositing and annealing. The one or more layers of high-k dielectric material 222 in a single-layer structure of atoms has a thickness in the range of about 0.1-0.3 nm, the temperature of the high-temperature annealing is in the range from about 500° C. to 950° C., the time for the high-temperature annealing is in the range from about 1 second to 30 seconds, and the protective gas for the high-temperature annealing is $N_2$, $NH_3$, or $O_2$.

Figure 11:
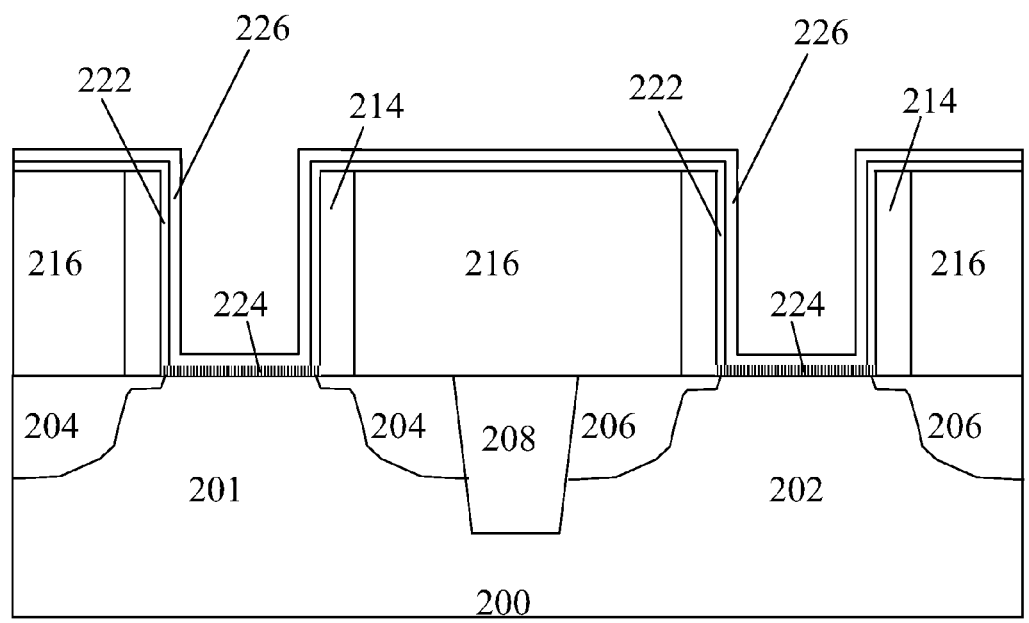

The flow then goes to step 105, with reference to FIG. 11, a first high-k gate dielectric layer 226 is formed on the first high-k interface layer 224 belonging to the first region 201, and a second high-k gate dielectric layer 226 is formed on the second high-k interface layer 224 belonging to the second region 202, wherein the dielectric constants of the first high-k gate dielectric layer and the second high-k gate dielectric layer are higher than those of the first high-k interface layer and the second high-k interface layer, respectively. The material of the first and second high-k gate dielectric layers 226 may comprise $HfO_2$, $ZrO_2$, $HfSiO_X$, $HfZrO_X$, HfON, HfSiON, $HfAlO_X$, $Al_2O_3$, ZrSiOx, $Ta_2O_5$, $La_2O_3$, $HfLaO_X$, $LaAlO_X$, $LaSiO_X$, $HfLaO_X$, $HfLaON_X$, etc. The method of depositing the first and second high-k gate dielectric layers 226 may include sputtering, PLD, MOCVD, ALD, PEALD, or other suitable methods. The first and second high-k gate dielectric layers 226 have a thickness in the range from about 1 to 5 nm.

Figure 12:
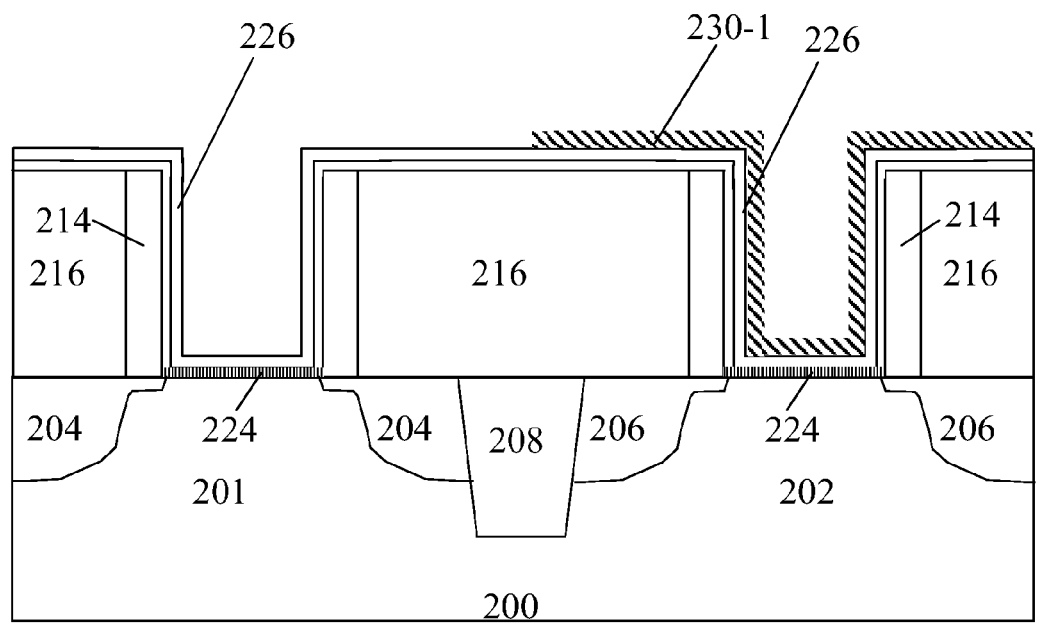
Figure 13:
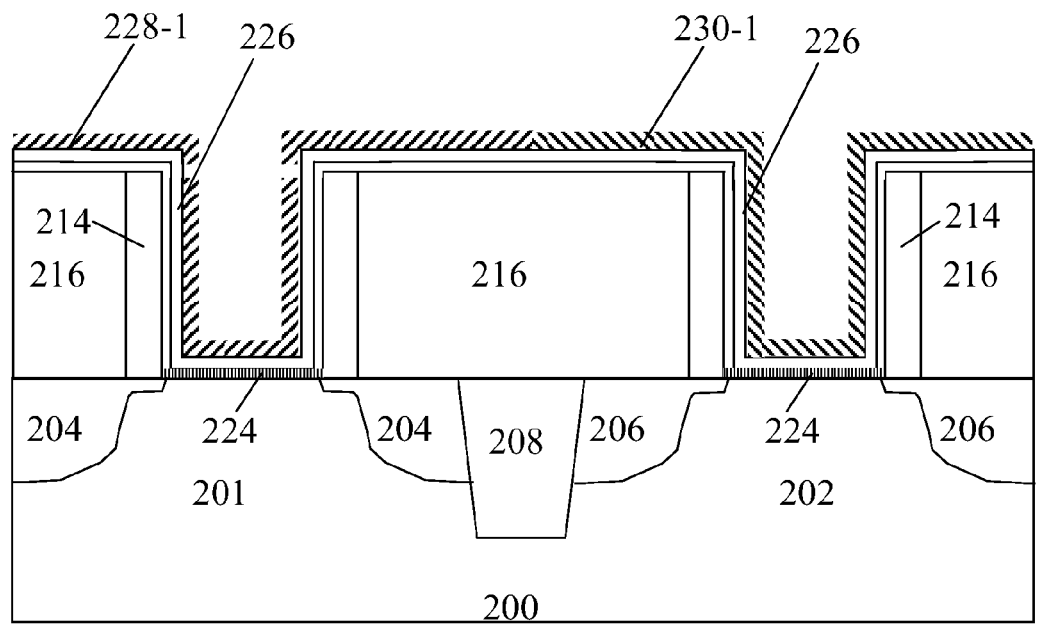
Figure 14:
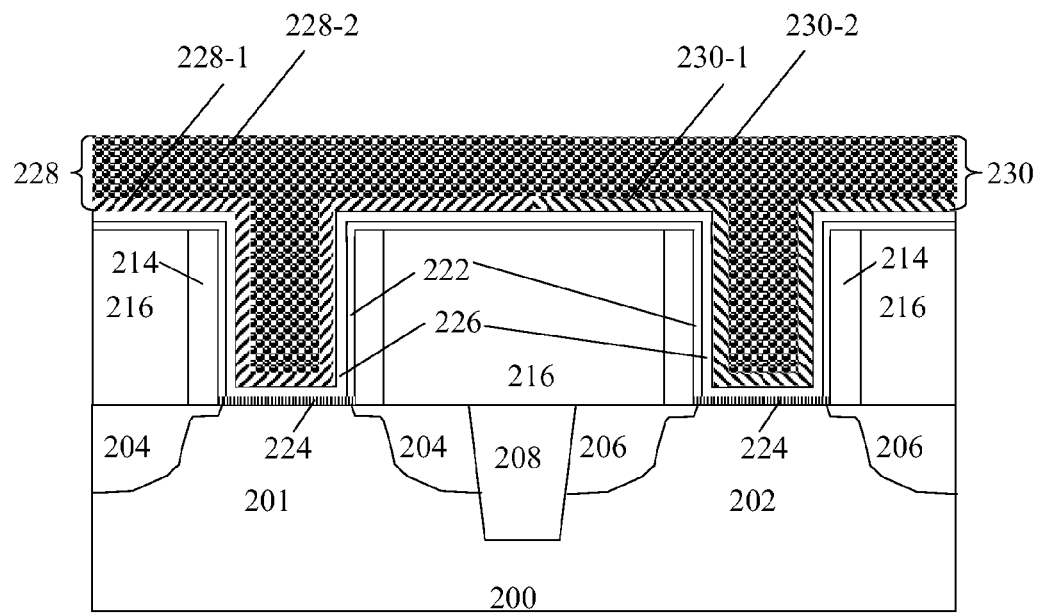

Then, the device may be further processed as manufacturing requirements. With reference to FIG. 14, the first metal gate layer 228 and the second metal gate layer 230 are formed on the first and second high-k gate dielectric layers 226, respectively. The first metal gate layer 228 and the second metal gate layer 230 are a one-layer or multiple-layer structure, which may be formed of the same or different materials, and may be deposited by materials selected from the following group comprising TaN, $Ta_2C$, HfN, HfC, TiC, TiN, MoN, MoC, TaTbN, TaErN, TaYbN, TaSiN, TaAlN, TiAlN, TaHfN, TiHfN, HfSiN, MoSiN, MoAlN, Mo, Ru, $RuO_2$, $RuTa_x$, $NiTa_x$, polystalline silicon or metal silicide, or any combination thereof In an embodiment, the first metal gate layer 228 and the second metal gate layer 230 are a two-layered structure. A metal material, for example, TaN, is deposited on the first and second high-k gate dielectric layers 226, and the metal material belonging to the first region is etched in order to form a second metal layer 230-1, as shown in FIG. 12. Then, another layer of metal material, for example, $Ta_2C$, is deposited on the first high-k gate dielectric layer 226 and the second metal layer 230-1, and the another layer of metal material belonging to the second region 202 on the second metal layer 230-1 is etched in order to form a first metal layer 228-1, as shown in FIG. 13, and the another layer of metal material, for example, $Ta_2C$ belonging to the second region 202 on the second metal layer 230-1 may also be retained. As shown in FIG. 14, a low-resistance metal layer 228-2 belonging to the first region 201 and a low-resistance metal layer 230-2 belonging to the second region are deposited on the first metal layer 228-1 and the second metal layer 230-1, respectively. The method for depositing the first metal gate layer 228 and the second metal gate layer 230 may comprise sputtering, PLD, MOCVD, ALD, PEALD, or other suitable methods. The above-mentioneds are only exemplary, and the present invention is not limited thereto.

Figure 15:
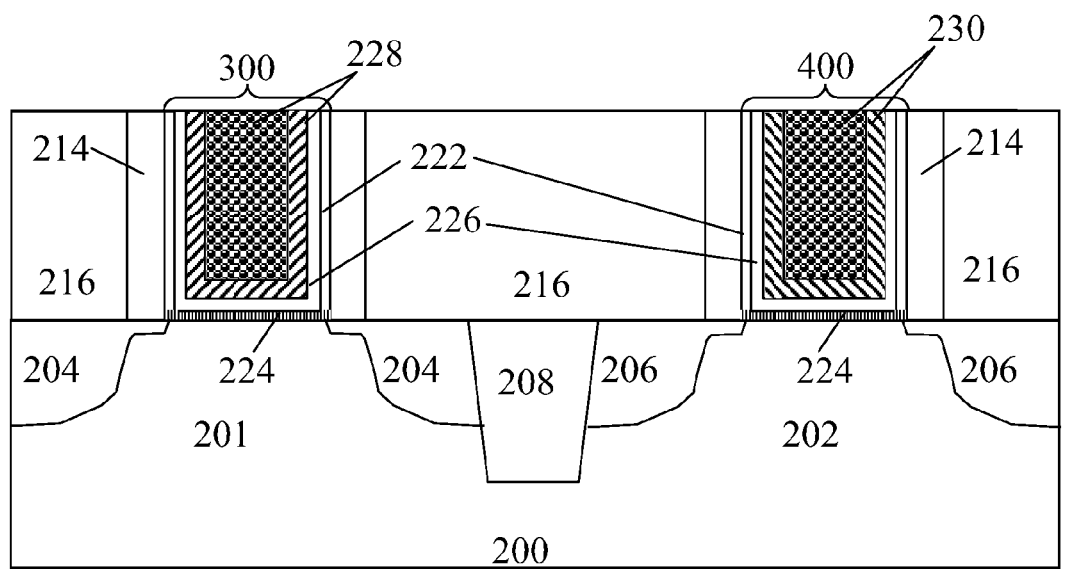

Finally, with reference to FIG. 15, the stack of layers formed previously are patterned in order to form a gate stack 300 of the device in the first region 201 and a gate stack 400 of the device in the second region 202. The gate stack 300 and gate stack 400 may be manufactured by one or more times of lithography to the stack of layers formed previously. Then, a semiconductor device according to an embodiment of the present invention is completed.

According to the present invention, during the process of manufacturing a CMOS transistor by using a replacement gate process, a multi-component high-k interface layer containing elements of the substrate is formed from an ultra-thin high-k dielectric material in a single-layer structure of atoms, and a high-k gate dielectric layer with a higher dielectric constant is formed thereon, by using rapid annealing. Because the high-k gate dielectric layer has a high dielectric constant, the EOT of the device is alleviated, and compared with the conventional $SiO_2$ interface layer, the optimized high-k interface layer containing elements of the substrate has a higher density of atoms and more advantageously blocks the diffusion of oxygen, which may prevent the diffusion of atoms in the high-k gate dielectric layer from an upper level thereof at high-temperature treatment, thus, the present invention can also well avoid the growth of the interface layers and the degradation of carrier mobility. Furthermore, the present invention can improve the problem of high interface state and interface roughness caused by direct contact of the high dielectric constant high-k gate dielectric layer and the substrate, and thus the overall performance of the device is effectively enhanced.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A semiconductor, comprising:
    a semiconductor substrate having a first region and a second region, wherein the first region and the second region are isolated from each other by an isolation region;
    a first gate stack formed on the first region, and a second gate stack formed on the second region; and
    a source region and a drain region belonging to the first region and the second region, respectively;
    wherein the first gate stack comprises: a first high-k interface layer on the semiconductor substrate in the first region; a first high-k gate dielectric layer on the first high-k interface layer;
    and a first metal gate layer on the first high-k gate dielectric layer;
    the second gate stack comprises: a second high-k interface layer on the semiconductor substrate in the second region; a second high-k gate dielectric layer on the second high-k interface layer; and a second metal gate layer on the second high-k gate dielectric layer; and
    the material of the first and second high-k interface layers comprises elements of the material of the substrate, and dielectric constants of the first and second high-k gate dielectric layers are higher than those of the first and second high-k interface layers, respectively.

2. The device according to claim 1, further comprising an interface layer between the first and second high-k interface layers and the substrate.

3. The device according to claim 1, wherein the first high-k interface layer and the second high-k interface layer are formed of elements selected from a group comprising:
    HfO2, ZrO2, HfZrOx, HfSiOx, Al2O3, HfAlOx, LaAlOx, Gd2O3, and oxide, silicate and nitride of other rare earth, or any combination thereof.

4. The device according to claim 1, wherein the first and second high-k interface layers have a thickness in the range of about 0.1-1 nm.

5. The device according to claim 1, wherein the first and second high-k gate dielectric layers are selected from a group comprising: HfO2, ZrO2, HfSiOx, HfZrOx, HfON, HfSiON, HfAlOx, Al2O3, ZrSiOx, Ta2O5, La2O3, HfLaOx, LaAlOx, LaSiOx, HfLaOX,or HfLaONx, or any combination thereof.

6. The device according to claim 1, wherein the first and second high-k gate dielectric layers have a thickness in the range of about 1-5 nm.

* * * * *